United States Patent
Ache et al.

(10) Patent No.: US 10,337,852 B1
(45) Date of Patent: Jul. 2, 2019

(54) METHOD FOR MEASURING POSITIONS OF STRUCTURES ON A SUBSTRATE AND COMPUTER PROGRAM PRODUCT FOR DETERMINING POSITIONS OF STRUCTURES ON A SUBSTRATE

(71) Applicant: KLA-TENCOR CORPORATION, Milpitas, CA (US)

(72) Inventors: Oliver Ache, Leun (DE); Frank Laske, Weilmünster (DE)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 16/007,192

(22) Filed: Jun. 13, 2018

Related U.S. Application Data (60) Provisional application No. 62/607,170, filed on Dec. 18, 2017.

(51) Int. Cl.
  *G01B 11/24* (2006.01)
  *G01B 11/00* (2006.01)

(52) U.S. Cl.
  CPC ........ *G01B 11/005* (2013.01); *G01B 2210/56* (2013.01)

(58) Field of Classification Search
  CPC ..... G01B 11/026; G01B 11/002; G01B 11/14; G01S 5/163; G01S 5/16
  USPC .......................................................... 356/614
  See application file for complete search history.

(56) References Cited

U.S. PATENT DOCUMENTS

| | | | |
|---|---|---|---|
| 7,830,493 B2 | 11/2010 | Tinnemans et al. | |
| 8,396,582 B2* | 3/2013 | Kaushal | G05B 13/0265 700/104 |
| 2008/0228308 A1* | 9/2008 | Phelps | H01L 21/67248 700/121 |
| 2009/0051936 A1* | 2/2009 | Schmidt | G01B 21/04 356/620 |
| 2009/0242513 A1* | 10/2009 | Funk | H01L 22/12 216/67 |
| 2011/0177624 A1 | 7/2011 | Camm et al. | |

(Continued)

FOREIGN PATENT DOCUMENTS

JP  2005310832 A  11/2005

OTHER PUBLICATIONS

ISA/KR, International Search Report and Written Opinion for PCT/US2018/066092 dated Apr. 12, 2019.

*Primary Examiner* — Md M Rahman
(74) *Attorney, Agent, or Firm* — Hodgson Russ LLP (57) ABSTRACT

A method with increased throughput for measuring positions of structures on a substrate is disclosed. The substrate is taken from a load port of a metrology machine and is placed immediately in a stage of the metrology machine. At least two measurement loops are carried out, wherein a first measurement loop is started at a time when a substrate temperature is different from the temperature at the stage, and at least one second measurement loop is started at a time after the first measurement loop when the substrate temperature is different from the temperature at the stage. A model is used to calculate from the measured data, taken while there is a temperature mismatch between the stage and the substrate, a real grid of positions of structures on the substrate, corresponding to a situation where the temperature of the stage matches the temperature of the substrate.

16 Claims, 6 Drawing Sheets

(56) References Cited

U.S. PATENT DOCUMENTS

2014/0065733 A1     3/2014   Ausschnitt
2017/0068171 A1     3/2017   Moest et al.

\* cited by examiner

Prior Art

METHOD FOR MEASURING POSITIONS OF STRUCTURES ON A SUBSTRATE AND COMPUTER PROGRAM PRODUCT FOR DETERMINING POSITIONS OF STRUCTURES ON A SUBSTRATE

CROSS-REFERENCE TO RELATED APPLICATIONS

The present application claims priority to United States Provisional Patent Application entitled SUPER SOAKING COMPENSATION, naming Oliver ACHE and Frank LASKE as inventors, filed Dec. 18, 2017, and assigned Application Ser. No. 62/607,170, the disclosure of which is incorporated herein by reference in its entirety.

TECHNICAL FIELD

The present disclosure generally relates to a method with increased throughput for measuring positions of structures on a substrate.

Furthermore the present disclosure generally relates to a computer program product disposed on a non-transitory computer readable medium for determining positions of structures on a substrate with increased throughput, the product comprising computer executable process steps operable to control a computer of a metrology machine for determining positions of structures on a substrate with increased throughput.

BACKGROUND

As the size of a substrate changes with its temperature, a difference between substrate temperature and the temperature within a climate chamber of a metrology machine causes the substrate to change its size while sitting on the stage of the metrology machine. If a substrate is not fully temperature-adjusted before measurement starts, this change in size leads to distorted measurement results.

The prior art measurement process is designed to wait for the substrate to become almost fully temperature-adjusted. This means the effect of a temperature difference between the climate chamber and the substrate is small enough to be ignored and does not have any effect on the measurement results of two consecutive measurement loops. The temperature match of the climate chamber and the substrate is determined by repeated measurement of two points or structures on the substrate. When the change in distance between two consecutive measurements is smaller than a given threshold, the substrate is considered to be fully temperature-adjusted.

The time required for a substrate to become fully temperature-adjusted primarily depends on the difference between the substrate temperature and the temperature within the climate chamber or temperature at the stage. It does not depend on the number of measurement sites. This means that for a measurement recipe (measurement process) with only a small number of measurement sites the overhead required for temperature adjustment is large compared with the time required for measuring the sites on the substrate. So, the time required for temperature adjustment is the main driver for limited throughput of substrates in a metrology machine.

It is an object of the present disclosure to provide a method for measuring positions of structures on a substrate which shows an increased throughput.

SUMMARY

The above object is achieved by a method for measuring positions of structures on a substrate comprising the steps of:
placing the substrate in a stage of a metrology machine, wherein the substrate carries a plurality of structures;
carrying out a first measurement loop and at least a second measurement loop according to a predefined recipe, wherein the first measurement loop is started at a time where a substrate temperature is different from the temperature at the stage, and the at least one second measurement loop is started at a time after the first measurement loop when the substrate temperature is different from the temperature at the stage;
obtaining from the first and at least one second measurement loops at least two distorted grids representing a two-dimensional distribution of the structures measured with the predefined recipe; and
calculating a real grid from at least two compensated grids, wherein each compensated grid is determined from each of the at least two distorted grids, and the real grid is similar to a measured grid where the temperature of the substrate is identical to the temperature of the stage.

It is a further object of the present disclosure to provide a computer program product comprising computer executable process steps operable to control a computer of a metrology machine for measuring positions of structures on a substrate with increased throughput.

The above object is achieved by a computer program product disposed on a non-transitory computer readable medium for determining positions of structures on a substrate, the product comprising computer executable process steps operable to control a computer of a metrology machine for measuring positions of structures on a substrate with increased throughput. The computer executable process steps are:
removing a substrate from a load port of the metrology machine;
placing the substrate on a stage of the metrology machine;
carrying out a first measurement loop according to a predefined recipe in order to measure positions, defined by an X-value and a Y-value, of a plurality of structures on the substrate, wherein a substrate temperature is different from the temperature at the stage;
carrying out, after the first measurement loop, at least one second measurement loop according to the predefined recipe in order to measure positions, defined by an X-value and a Y-value, of a plurality of structures on the substrate, wherein the substrate temperature is different from the temperature at the stage;
obtaining from the first and the at least one second measurement loops at least two distorted grids representing a two-dimensional distribution of the structures measured with the predefined recipe; and
calculating a real grid from at least two compensated grids, wherein each compensated grid is determined from each of the at least two distorted grids, and the real grid is similar to a measured grid where the temperature of the substrate is identical to the temperature of the stage.

The method of the present disclosure for measuring positions of structures on a substrate moves the substrate right from a load port onto a stage. The movement of the stage is controlled by a computer or computer system of the metrology machine in order to move the structures or sites of the substrate into an optical axis of a measuring objective of the metrology machine. The method carries out at least two measurement loops according to a predefined recipe. A first measurement loop is started at a time where a substrate temperature is different from a temperature at the stage. At least one second measurement loop is started at a time after the first measurement loop has finished and when the substrate temperature is still different from the temperature at the stage. Comparing the measurement results of the first measurement loop with the measurement results of the at least one second measurement loop, the position of the structures or sites on the substrate differs between the first measurement loop and the at least one second measurement loop. The difference is due to thermal expansion of the substrate which takes place during the time period the substrate temperature adjusts to the stage temperature to within a predefined threshold.

According to one possible embodiment of the present disclosure, the temperature of the stage and the temperature of the substrate are measured before a measurement loop starts. The temperature measurement enables the determination of the temperature difference between the substrate and the stage.

According to another possible embodiment of the present disclosure, the temperature of the stage and the temperature of the substrate are measured during the run of the first or of one of the at least one second measurement loop. This allows to determine any changes of the temperature difference between the substrate and the stage during the run of the first or of one of the at least one second measurement loop.

From the first and the at least one second measurement loops one obtains at least two distorted grids representing a two-dimensional distribution of the structures measured with the predefined recipe.

A real grid, which represents the positions of the structures or sites on a substrate at the temperature equilibrium of the substrate and the stage, is calculated from at least two compensated grids. Each of the compensated grids is determined from each of the at least two distorted grids. The real grid is similar to a measured grid where the temperature of the substrate matches the temperature of the stage to within a predetermined threshold. The predetermined threshold is a temperature interval where the substrate is stable with regard to the thermal expansion.

In a first calculation step plural high grids are determined from the first and the at least one second measurement loops. Here a transition function is created in order to predict at least one high grid which translates the at least one second measurement loop to the first measurement loop. In case there is more than one second measurement loop, an individual high grid is predicted for each second measurement loop. Each high grid translates the respective second measurement loop to the first measurement loop.

In a second calculation step a fit to a model is carried out with the at least one high grid to achieve an artificial high grid. The model describes how the measurement results from the first and the at least one second measurement loops are affected by a degree of temperature adjustment between the substrate and the stage.

In a third calculation step at least one further artificial high grid is calculated by subtracting at least one high grid from the previous calculated artificial high grid.

In a fourth calculation step plural compensated (temperature compensated) measurement loops are determined by an addition of the respective measurement loop and the artificial high grid. Finally an average is formed from the plural compensated measurement loops in order to obtain a final calculated grid of positions of structures or sites on the substrate. The final calculated grid corresponds to the real grid.

The same steps, mentioned above, relate to a computer program product, which is disposed on a non-transitory computer readable medium for determining positions of structures on a substrate. The product includes computer executable process steps operable to control a computer of a metrology machine for measuring positions of structures on a substrate.

The method of the present disclosure is primarily advantageous for substrates where a selected number of structures, distributed in a grid, are measured. Small recipes are designed in order to measure the positions of structures or sites on a substrate. A measurement recipe is considered small if fifty or fewer structures or sites on a substrate are measured. Small recipes increase the substrate throughput.

The temperature adjustment is neither a chaotic nor a linear process. Instead, it starts pretty quick and slows down the more the closer the substrate temperature comes to the target temperature (the temperature set inside the climate chamber). Since the speed of reaching the target temperature depends on the initial difference $\Delta T$ of temperatures, it is possible to make a prediction of how a measurement of a fully temperature adjusted substrate would look like.

The method of the present disclosure takes advantage of a model that describes how the measurement results are affected by a time of the substrate on the stage of the measurement machine. During the temperature adjustment process, the size of the substrate or the temperature-induced distortion changes over time. Therefore, a position measurement of a site on the substrate carried out during the first measurement loop shows a deviation from the position measurement of the same site taken during a second measurement loop (later in time). The deviation of each measured site is determined in the X-coordinate direction and the Y-coordinate direction. The time is indicative of the temperature adjustment of the substrate. Based on this model plus the measured data (for example the positions of features on a substrate determined during one loop), it is possible to create a transition function that compensates the effect of temperature adjustment.

It is to be understood that both the foregoing general description and the following detailed description are exemplary and explanatory only and are not necessarily restrictive of the disclosure as claimed. The accompanying drawings, which are incorporated in and constitute a part of the specification, illustrate embodiments of the disclosure and together with the general description, serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
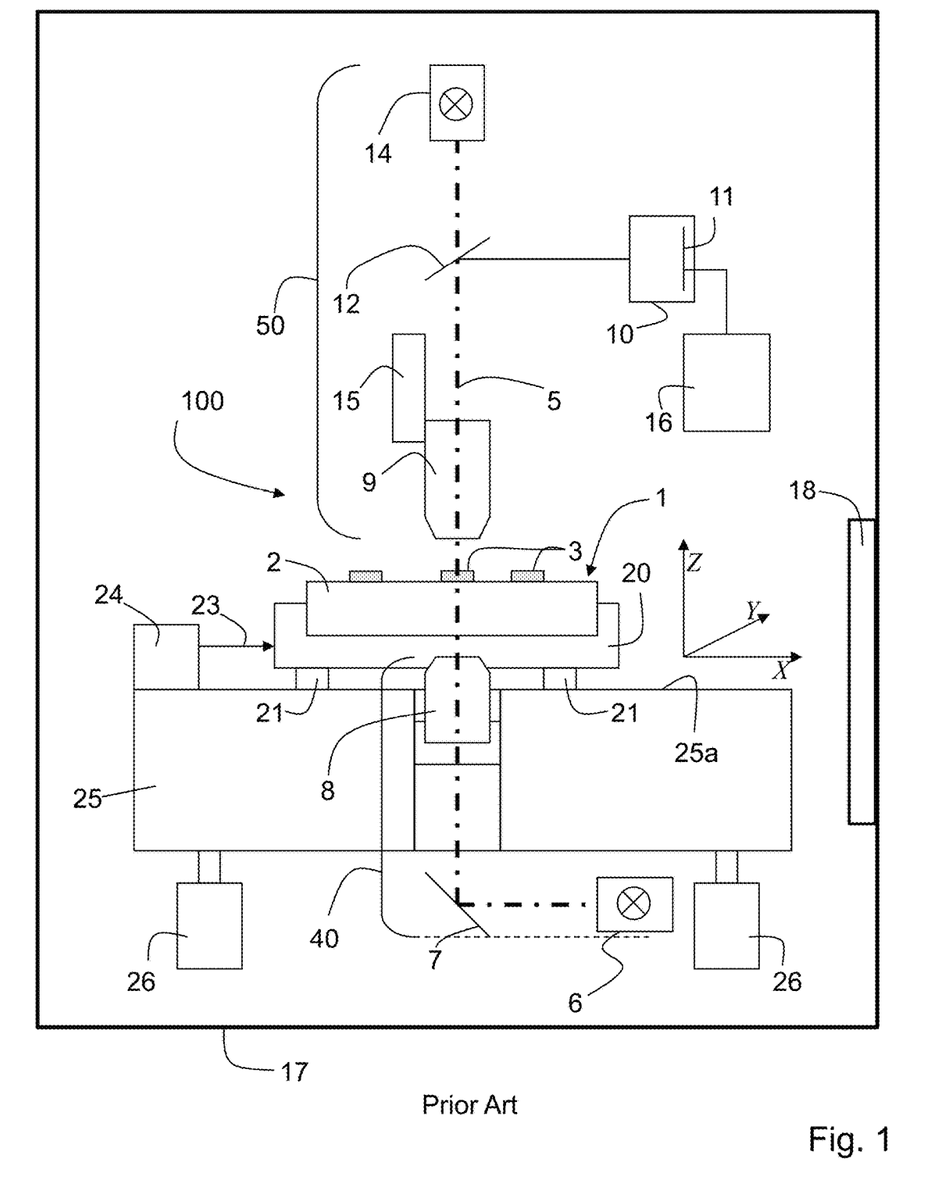
FIG. 1 is a schematic view of a conventional metrology machine for measuring the position of structures on a substrate.

FIG. 1 illustrates a schematic representation of a coordinate measuring machine or metrology machine 100 as has long been known from the prior art. The metrology machine 100 shown here is only one example of an apparatus which can be used to perform the method according to the disclosure. In no way is the method according to the disclosure limited to the specific configuration of such a metrology machine 100 shown in the figure.

A metrology machine 100 is used, for example, for determining the width (CD—critical dimension) of a structure 3 on a substrate 2. Also, using the metrology machine 100, the position of at least one structure 3 on the substrate 2 can be determined. The substrate 2 may for example be a wafer with a structured surface or a mask 1 exhibiting structures 3, to be transferred to a wafer by a photolithography process. Although the metrology machine 100 shown in FIG. 1 has long been known from prior art, for the sake of completeness, the operation of the metrology machine 100 and the arrangement of the individual elements of the metrology machine 100 will be described.

The metrology machine 100 comprises a stage 20, which is arranged so as to be displaceable on air bearings 21 in a plane 25a in the X-coordinate direction and in the Y-coordinate direction. Types of bearings other than air bearings can also be used to move the stage in the X-coordinate direction X and in the Y-coordinate direction Y. The plane 25a is defined by a massive element 25. In a preferred embodiment, the massive element 25 is a formed granite block. However, to a person skilled in the art, it is obvious that the element 25 can be made from a different material which provides a precise plane for the displacement of the stage 20. The position of the stage 20 is measured by means of at least one laser interferometer 24. To carry out the measurement, the at least one laser interferometer 24 emits a light beam 23 which hits the stage 20. From the position of the stage 20 the position of the mask 1 can be determined.

In particular, the position of the mask 1 relative to a field of view (not shown) is determined. The massive element 25 itself is mounted on oscillation dampers 26 in order to prevent for example building oscillations from reaching the device.

The mask 1 can be illuminated with a transmitted light illumination system 6 and/or a reflected light illumination system 14. The transmitted light illumination system 6 is provided in an optical arrangement 40. The reflected light illumination system 14 is also provided in an optical arrangement 50. The optical arrangement 40 comprises the transmitted light illumination system 6, a deflecting mirror 7, and a condenser 8. By means of the deflecting mirror 7 the light from the transmitted light illumination system 6 is directed to the condenser 8. The further optical arrangement 50 comprises the reflected light illumination system 14, a beam-splitting mirror 12, the measuring objective 9 and a displacing device 15 of the measuring objective 9. Using the displacing device 15 the measuring objective 9 can be displaced in the Z-coordinate direction Z (e.g. for focusing). The measuring objective 9 collects light coming from the mask 1, and the light is then deflected out of the reflected light illumination axis 5 by means of the partially transparent deflecting mirror 12. The light passes to a camera 10 which is provided with a detector 11. The detector 11 is linked to a computer system 16 which generates digital images from the measurement values determined by the detector 11. The computer system 16 carries out all the calculations which are necessary to determine the position of the structure 3 or structures 3 on the mask 1.

In particular, the field of view is defined by the measuring objective 9, the camera 10 and the detector 11 of the camera 10 of the metrology machine 100. The imaging system of the metrology machine 100 mainly comprises the measuring objective 9, the camera 10 and the detector 11. In order or obtain a constant climate (temperature, humidity, pressure etc.) for the measurement, the metrology machine 100 is placed within a climate chamber 17. The climate chamber 17 has a load port 18, which allows the transfer of the substrates 2 or masks 1 onto and out of the climate chamber 17.

Figure 2:
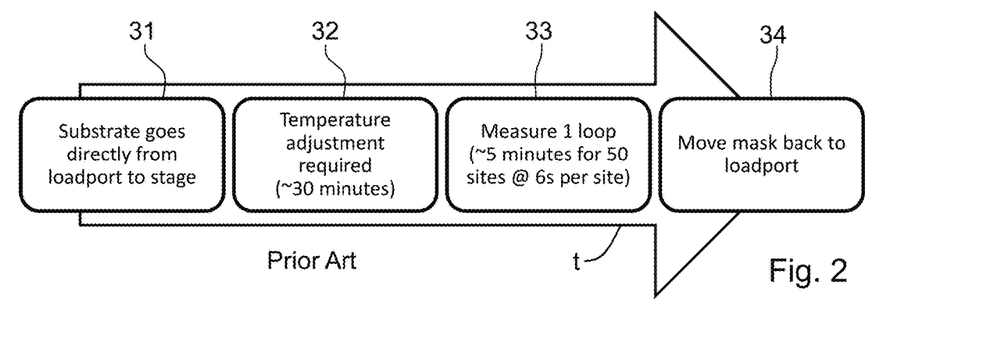
FIG. 2 is a schematic diagram of a timeline of a conventional measuring process of features on a substrate.

FIG. 2 is a schematic diagram of a timeline of a conventional measuring process of the positions of features on a substrate 2. In a first step 31 the substrate 2 goes directly from the load port 18 to the stage 20 of the metrology machine 100. In a second step 32 the substrate 2 stays on the stage 20 for approximately thirty minutes. No measurements are carried out until a temperature adjustment is reached between the substrate 2 and the environmental temperature inside the climate chamber 17 for the metrology machine 100. In a third step 33, for example, a measurement loop covers fifty sites on the substrate 2. The measurement loop of the fifty sites takes about five minutes. The measurement per site requires 6 seconds. In a fourth step 34 the substrate is moved back to the load port 18.

Figures 3, 4:
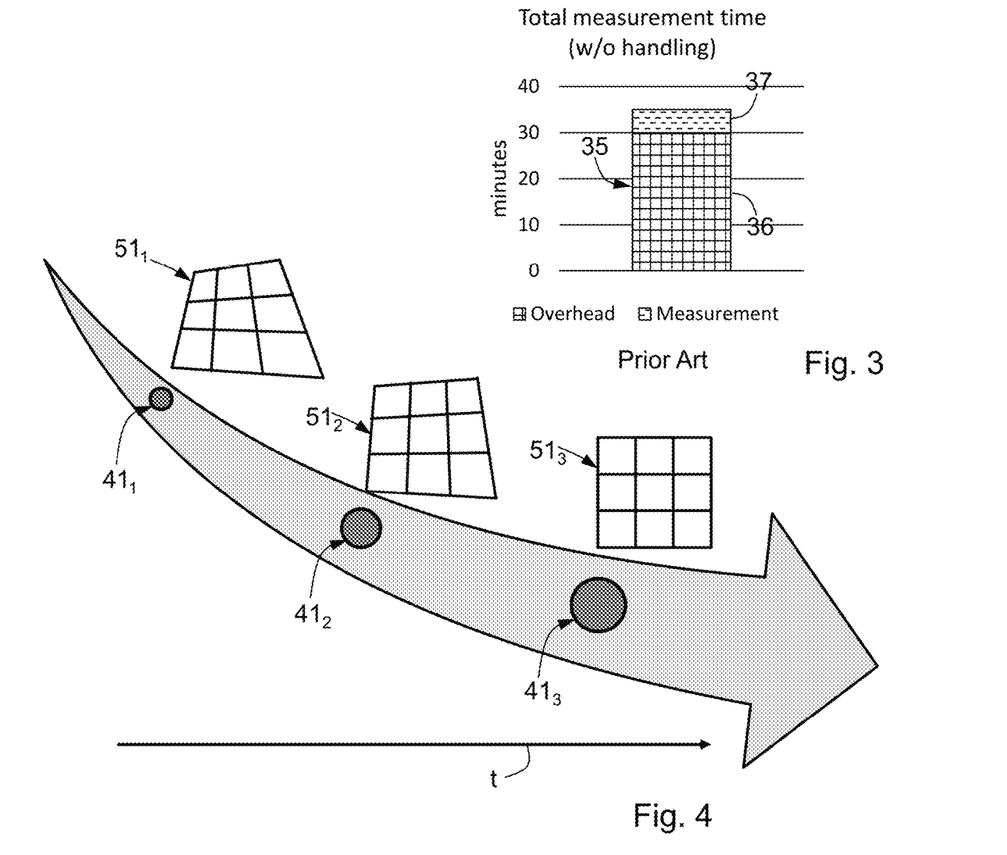
FIG. 3 is a diagram illustrating the measurement time and the time in which the substrate reaches a temperature equilibrium.
FIG. 4 is a simplified view of an embodiment of the present disclosure of starting the measurement loops almost immediately after placing the substrate on the stage of the metrology machine.

In FIG. 3 the measurement time 35 of fifty sites on a substrate 2 is illustrated. The total measurement time 35 of the fifty site takes thirty five minutes. Thirty minutes of the total measurement time 35 are overhead 36, where no measurement is carried out. Only five minutes the total measurement time 35 are used for measurement 37.

FIG. 4 shows a simplified view of the method of the present disclosure. In contrast to the conventional measurement process, the plural measurement loops $41_1$, $41_2$, ..., $41_N$ are started almost immediately after placing the substrate 2 on the stage 20 of the metrology machine 100. In the example shown three measurement loops $41_1$, $41_2$ and $41_3$ are carried out. The temperature adjustment is skipped. A first measurement loop $41_1$, a second measurement loop $41_2$ and a third (further second) measurement loop $41_3$ show the differences between the respective two-dimensional distorted grids $51_1$, $51_2$ and $51_3$. For example, the first measurement loop $41_1$ is carried out immediately after the substrate 2 is placed on the stage 20. The second measurement loop $41_2$ and the third measurement loop 43 are performed later in time t. With the first measurement loop $41_1$ a first distorted grid $51_1$ of the substrate 2 is determined. With the second measurement loop $41_2$ a second distorted grid $51_2$ of the substrate 2 is determined. With the third measurement loop $41_3$ a third distorted grid $51_3$ of the substrate 2 is determined. As shown in FIG. 4, with elapsed time t the second distorted grid $51_2$ is less distorted than the first grid $51_1$ and the third distorted grid $51_3$ is less distorted than the second distorted grid $51_2$.

Figure 5:
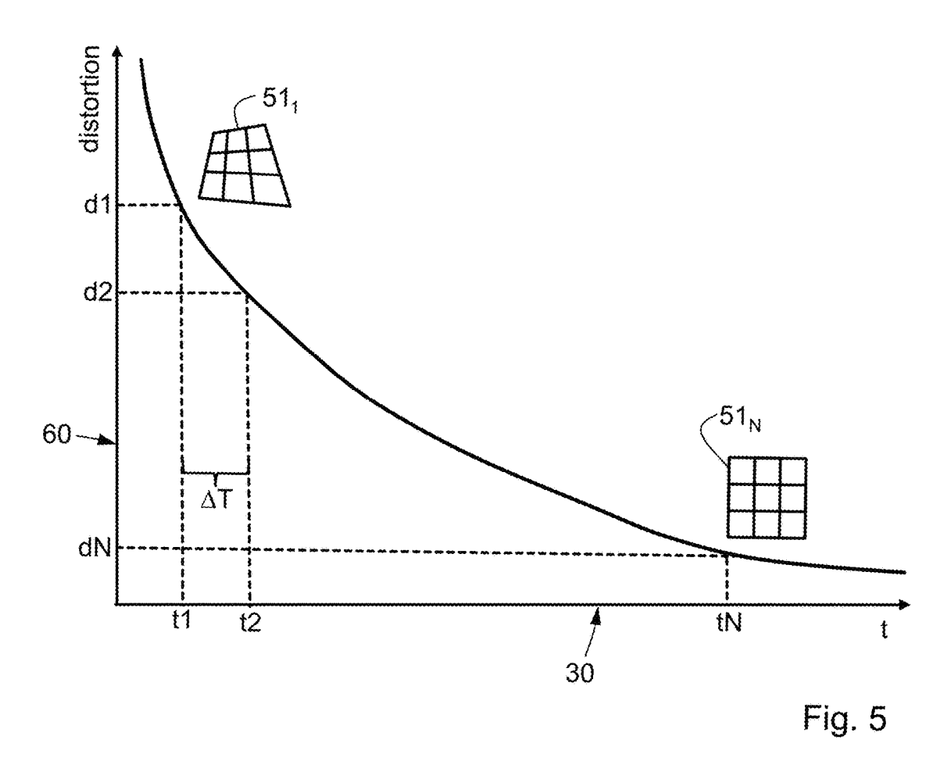
FIG. 5 is a graphical representation of the measured distortion as a function of time.

FIG. 5 is a graphical representation of the measured distortion as a function of time t. The abscissa 30 shows the time t which the substrate 2 has already been in the stage 20 of the metrology machine 100. The ordinate 60 shows a value of the distortion, indicated are distortion values d1, d2, ..., dN for the respective measured distorted grids $51_1$, $51_2$, ..., $51_N$ determined at respective points in time t1, t2, ..., tN.

As shown in FIG. 5 the difference d2−d1 of the distortions and the difference t2−t1 of the points in time are determined. The value of $$\frac{d2 - d1}{t2 - t1}$$

is unique. The distortion dN (the temperature difference is within a predefined threshold which means that the determined distortion does not change for two consecutive measurements) can be calculated by:

$$dN=f(tN)$$

wherein a compensation C is determined by dN−d1.

The method of the present disclosure takes advantage of a model that describes how the measurement results are affected by the temperature adjustment. Based on this model plus measured data it is possible to create a transition function that compensates the effect of temperature adjustment. The transition function for the distortion as a function of time t can be defined by the following function:

$$d(t)=a \times e^{(b \times t)}+c$$

Where a, b and c are coefficients describing the exponential function. The function allows the calculation of the distortion at the temperature equilibrium from measured distortion values, which are taken at points in time when the temperature difference between the substrate 2 and the climate chamber 17 still has an effect on the measured grid distortions.

According to one embodiment of the present disclosure, it is enough to measure only a single loop (to measure the position of the structures 3 on the substrate according to the recipe) and determine ΔT (the temperature difference between two consecutive measurement loops) in the graph as shown in FIG. 5. One loop is sufficient because the relationship between time t and temperature differences ΔT is one-to-one.

The differences in scale are measured that occur during the run of the recipe of a measurement loop. From the differences the current ΔT is derived.

The temperature of substrate 2 is measured before or during the run of the recipe of the measurement loop. ΔT is the difference between the temperature of substrate 2 and the temperature of stage 20.

It should be noted that there are different ways how to create and adjust the model described in FIG. 5.

FIG. 6 to FIG. 9 show the four calculation steps 61, 62, 63 and 64 which are applied in order to obtain a real grid (plural position data in X-coordinate direction X and Y-coordinate direction Y) from the measured and calculated data at different points in time. The model as described in FIG. 5 is applied to determine a final distortion dN which provides the position of the measured structures (sites) on a substrate at the temperature equilibrium.

Figure 6:
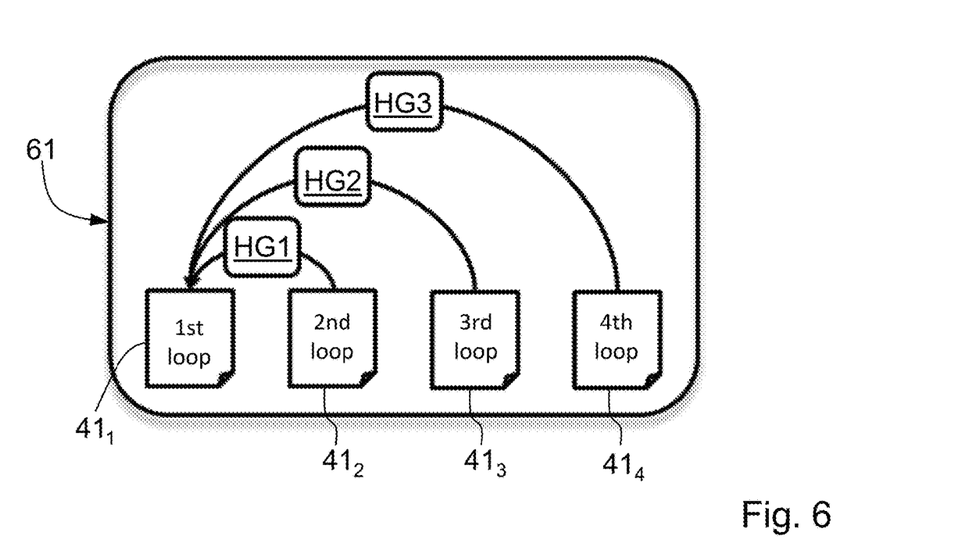
FIG. 6 is a schematic representation of a first calculation step of the method of the present disclosure, wherein a set of high grids are determined.

FIG. 6 is a schematic representation of a first calculation step 61 of the method of the present disclosure, wherein a set of high grids are determined from plural measurement loops $41_1$, $41_2$, ..., $41_N$. In the example shown a first measurement loop $41_1$, a second measurement loop $41_2$, a third (further second) measurement loop $41_3$ and a fourth (further second) measurement loop $41_4$ are carried out. Each measurement loop $41_1$, $41_2$, $41_3$ and $41_4$ measures positions of structures 3 (sites) on a substrate 2 according to a defined recipe. The number of structures 3 or sites are the determined such that the time of measurement does not exceed five seconds per measurement loop. From data measured by each measurement loop $41_1$, $41_2$, $41_3$ and $41_4$ a transition function is created for each measurement loop $41_1$, $41_2$, $41_3$ and $41_4$. The model (see FIG. 5) is used to adjust the components of the transition functions in order to predict a first high grid HG1, which represents the transition from the second measurement loop $41_2$ to the first measurement loop $41_1$. A second high grid HG2 represents the transition from the third measurement loop $41_3$ to the first measurement loop $41_1$. A third high grid HG3 represents the transition from the fourth measurement loop $41_4$ to the first measurement loop $41_1$.

Figure 7:
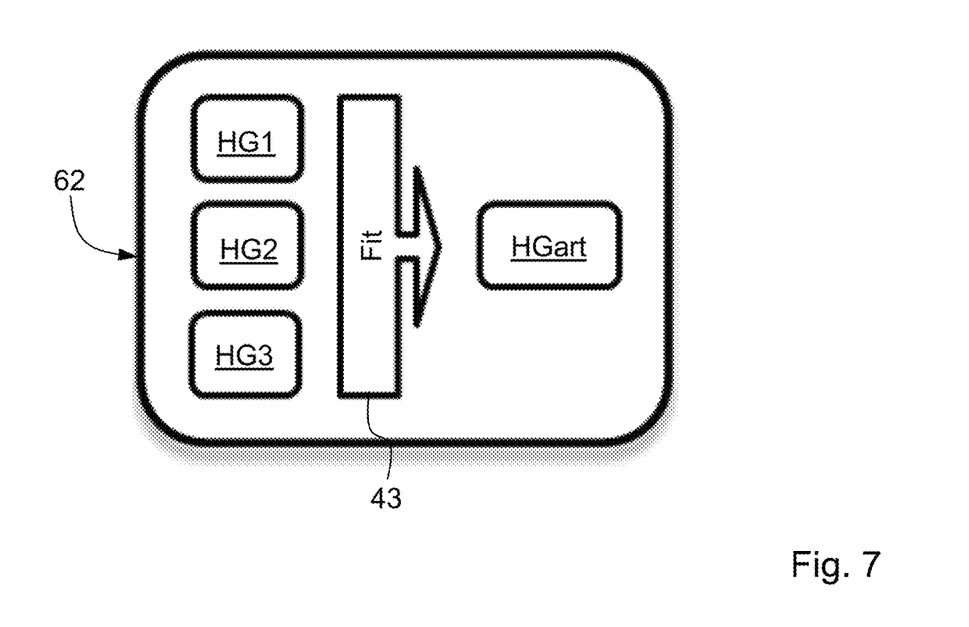
FIG. 7 is a schematic representation of a second calculation step of the method of the present disclosure, which determines an artificial high grid from the high grids.

FIG. 7 is a schematic representation of a second calculation step 62 of the method of the present disclosure. A fit 43 is carried out with first high grid HG1, second high grid HG2 and third high grid HG3 in order to achieve an artificial high grid HGart.

Figure 8:
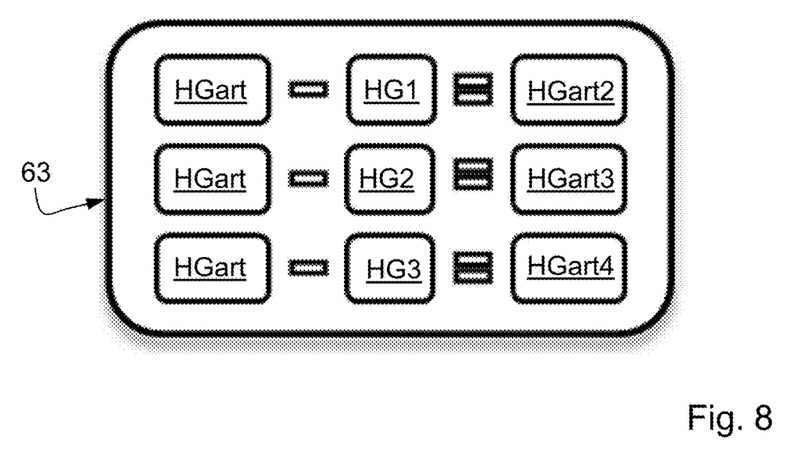
FIG. 8 is a schematic representation of a third calculation step of the method of the present disclosure, which determines three different artificial high grids.

FIG. 8 is a schematic representation of a third calculation step 63 of the method of the present disclosure. A second artificial high grid HGart2 is calculated by subtracting the first high grid HG1 form the artificial high grid HGart. A third artificial high grid HGart3 is calculated by subtracting the second high grid HG2 form the artificial high grid HGart. A fourth artificial high grid HGart4 is calculated by subtracting the third high grid HG3 form the artificial high grid HGart.

Figure 9:
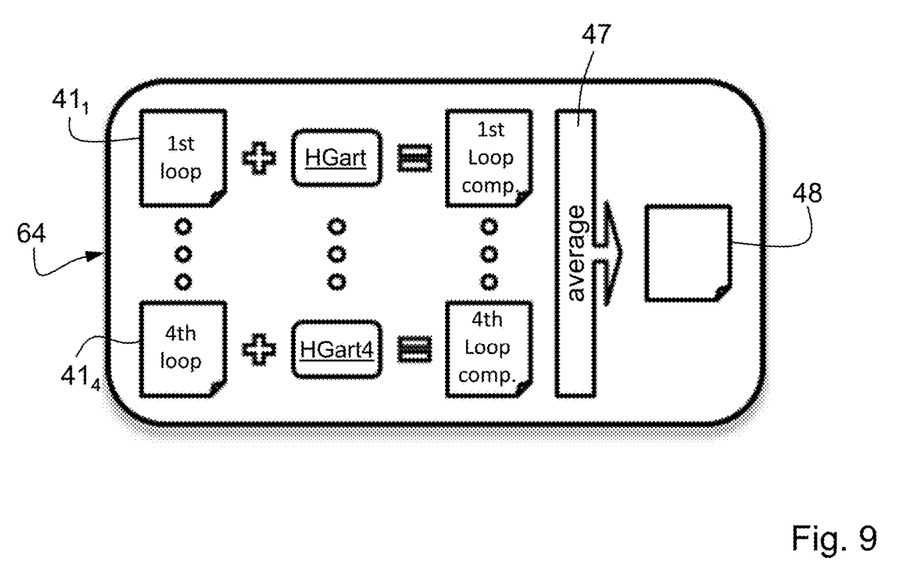
FIG. 9 is a schematic representation of a fourth calculation step of the method of the present disclosure, which determines the final measured and calculated data.

FIG. 9 is a schematic representation of a fourth calculation step 64 of the method of the present disclosure. A first compensated measurement loop $45_1$ is determined by the summation of the first measurement loop $41_1$ with the artificial high grid HGart. A second compensated measurement loop $45_2$ (not shown) is determined by the addition of the second measurement loop $41_2$ with the second artificial high grid HGart2. A third compensated measurement loop $45_3$ (not shown) is determined by the addition of the third measurement loop $41_3$ with the third artificial high grid HGart3. A fourth compensated measurement loop $45_4$ is determined by the addition of the fourth measurement loop $41_4$ with the fourth artificial high grid HGart4. An average 47 is formed from the first compensated measurement loop $45_1$, the second compensated measurement loop $45_2$, the third compensated measurement loop $45_3$ and the fourth compensated measurement loop $45_4$. The result is a final calculated grid 48 of data of positions (X/Y values along the X-coordinate direction X and the Y-coordinate direction Y) of structures 3 or sites on a substrate 2. The final calculated real grid 48 is comparable to a grid obtained from a conventional and time consuming measurement process of structures 3 on a substrate 2.

Figure 10:
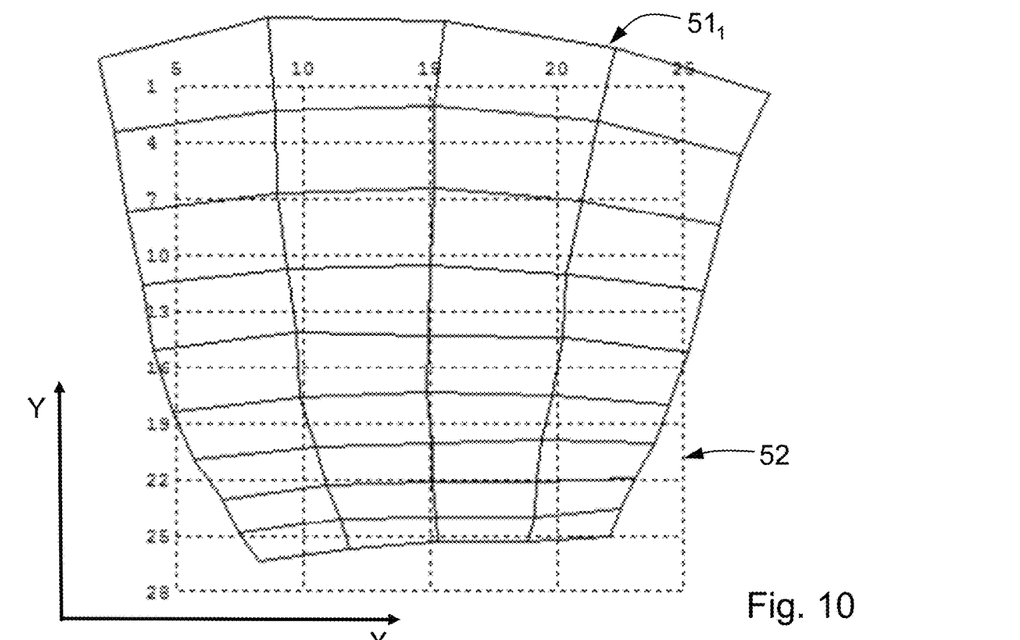
FIG. 10 is a comparison of measured positions of features on a substrate obtained during a first loop with the actual positions of the features on the substrate.

FIG. 10 is a comparison of measured positions of structures 3 or sites on a substrate obtained during a measurement loop. The position measurement is carried out for the measurement results shown in FIG. 10 with a recipe to measure fifty structures 3 or sites on a substrate 2. The structures 3 or sites are measured at a condition where the temperature of the substrate 2 differs from the temperature inside the climate chamber 17 of the metrology machine 100. The fifty structures 3 on the substrate 2 are measured at different times. The first distorted grid $51_1$ (see FIG. 10) represents the measurement results which are recorded at a first time with the metrology machine 100 according to a predetermined recipe. The real grid 52 is represented by dashed lines. The difference between the first distorted grid $51_1$ and the real grid 52 is obvious form FIG. 10.

Figure 11:
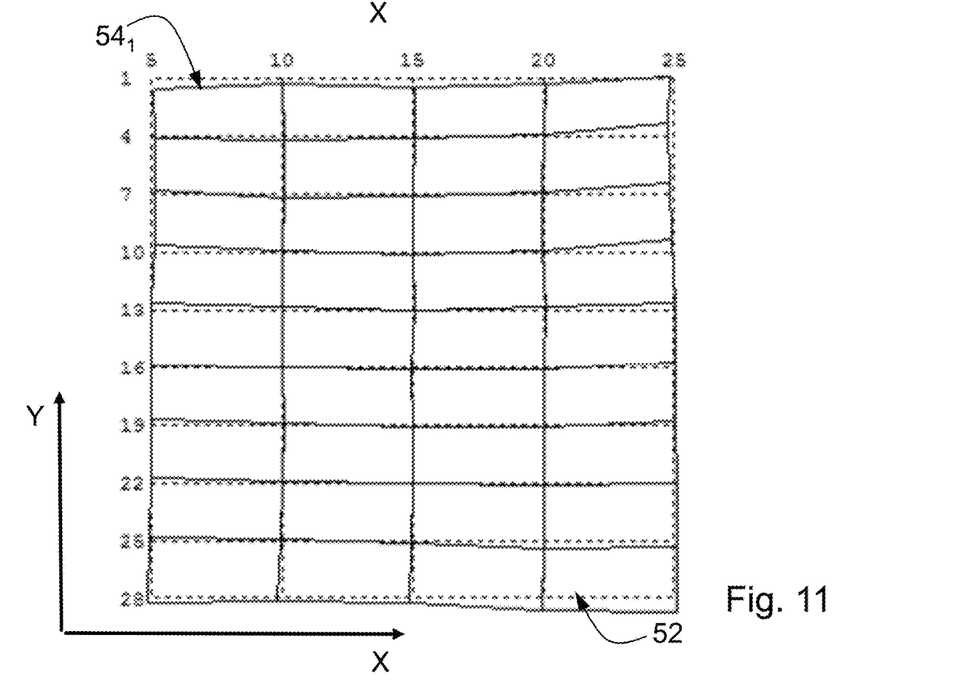
FIG. 11 is a comparison of positions of features on a substrate calculated from measured data of the first loop for a temperature adjusted substrate with the actual positions of the features on the substrate.

FIG. 11 shows a first compensated grid $54_1$ which is generated from first distorted grid $51_1$. The first compensated grid $54_1$ shows some deviations from the real grid 52, but is much closer than the first distorted grid $51_1$.

Furthermore, it is to be understood that the present disclosure is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to disclosure containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

LIST OF REFERENCE NUMERALS

1 mask
2 substrate
3 structure
5 reflected light illumination axis
6 transmitted light illumination system
7 deflecting mirror
8 condenser
9 measuring objective
10 camera
11 detector
12 beam-splitting mirror
14 reflected light illumination system
15 displacing device
16 computer system
17 climate chamber
18 load port
20 stage
21 air bearings
23 light beam
24 laser interferometer
25 massive element
25a plane in X-coordinate direction and Y-coordinate direction
26 oscillation dampers
30 abscissa
31 first step
32 second step
33 third step
34 fourth step
40 optical arrangement
$41_1, 41_2, \ldots, 41_N$ measurement loop
43 fit
$45_1, 45_2, \ldots, 45_N$ compensated measurement loop
47 average
48 real grid
50 optical arrangement
$51_1, 51_2, \ldots, 51_N$ distorted grid
52 real grid
$54_1, 54_2, \ldots, 54_N$ compensated grid
60 ordinate
61 first calculation step 62 second calculation step
63 third calculation step
64 fourth calculation step
100 metrology machine
d1, d2, . . . ,dN distortion value
HG1 first high grid
HG2 second high grid
HG3 third high grid
HGart artificial high grid
HGart2 second artificial high grid
HGart3 third artificial high grid
HGart4 fourth artificial high grid
t time [a.u.]
t1, t2, . . . ,tN point in time
X X-coordinate direction
Y Y-coordinate direction
Z Z-coordinate direction

What is claimed is:

1. A method for measuring positions of structures on a substrate comprising the steps of:
   placing the substrate in a stage of a metrology machine, wherein the substrate carries a plurality of structures;
   carrying out a first measurement loop and at least one second measurement loop according to a predefined recipe, wherein the first measurement loop is started at a time where a substrate temperature is different from the temperature at the stage, and the at least one second measurement loop is started at a time after the first measurement loop and when the substrate temperature is different from the temperature at the stage;
   obtaining from the first and the at least one second measurement loops at least two distorted grids representing a two-dimensional distribution of the structures measured with the predetermined recipe; and
   calculating a real grid from the at least two compensated grids, wherein each compensated grid is determined from each of the at least two distorted grids, and the real grid is similar to a measured grid where the temperature of the substrate matches the temperature of the stage within a predetermined threshold.

2. The method of claim 1, wherein calculating a real grid from the at least two compensated grids comprises:
   a first calculation step wherein at least one high grid is determined from the first measurement loop and the at least one second measurement loop, and a transition function is created in order to predict at least one high grid which translates the at least one second measurement loop to the first measurement loop.

3. The method of claim 2, wherein calculating a real grid from the at least two compensated grids further comprises:
   a second calculation step wherein a fit to a model is carried out with the at least one high grid to achieve an artificial high grid and the model describes how the measurement results from the first measurement loop and the at least one second measurement loop are affected by a degree of temperature adjustment between the substrate and the stage.

4. The method of claim 3, wherein calculating a real grid from the at least two compensated grids further comprises:
   a third calculation step wherein at least one further artificial high grid is calculated by subtracting at least one high grid from the previous calculated artificial high grid.

5. The method of claim 4, wherein calculating a real grid from the at least two compensated grids further comprises:
   a fourth calculation step wherein plural compensated measurement loops are determined by an addition of the respective measurement loops and the respective artificial high grid.

6. The method of claim 5, wherein an average is formed from the at least one compensated measurement loop in order to obtain a final calculated grid of positions of structures or sites on the substrate.

7. The method of claim 1, wherein the temperature of the stage and the temperature of the substrate are measured in order to determine the temperature difference between the substrate and the stage when the at least one measurement loop is carried out.

8. The method of claim 1, wherein the temperature of the stage and the temperature of the substrate are measured during the run of the at least one measurement loop in order to determine any changes of the temperature difference between the substrate and the stage during the run of the at least one measurement loop.

9. A computer program product disposed on a non-transitory computer readable medium for determining positions of structures on a substrate, the product comprising computer executable process steps operable to control a computer of a metrology machine for measuring positions of structures on a substrate, which process steps are:
   removing a substrate from a load port of the metrology machine;
   placing the substrate on a stage of the metrology machine;
   carrying out a first measurement loop according to a predefined recipe in order to measure positions, defined by an X-value and a Y-value, of a plurality of structures on the substrate, wherein a substrate temperature is different from a temperature at the stage;
   carrying out, after the first measurement loop, at least one second measurement loop according to a predefined recipe in order to measure positions, defined by an X-value and a Y-value, of a plurality of structures on the substrate, wherein the substrate temperature is different from the temperature at the stage;
   obtaining from the first measurement loop and the at least one second measurement loop at least two distorted grids representing a two-dimensional distribution of the structures measured with the predefined recipe; and
   calculating a real grid from at least two compensated grids, wherein each compensated grid is determined from each of the at least two distorted grids, and the real grid is similar to a measured grid where the temperature of the substrate is identical to the temperature of the stage.

10. The computer program product of claim 9, wherein calculating a real grid from the at least two compensated grids comprises:
    a first calculation step wherein at least one high grid is determined from the first measurement loop and the at least one second measurement loop, and a transition function is created in order to predict at least one high grid which translates from the at least one second measurement loop to the first measurement loop.

11. The computer program product of claim 10, wherein calculating a real grid from the at least two compensated grids further comprises:
    a second calculation step wherein a fit to a model is carried out with the at least one high grid to achieve an artificial high grid and the model describes how the measurement results from the first measurement loop and the at least one second measurement loop are affected by a temperature adjustment between the substrate and the stage.

12. The computer program product of claim 11, wherein calculating a real grid from the at least two compensated grids further comprises:
   a third calculation step wherein at least one further artificial high grid is calculated by subtracting at least one high grid from the previous calculated artificial high grid.

13. The computer program product of claim 12, wherein calculating a real grid from the at least two compensated grids comprises:
   a fourth calculation step wherein at least one compensated measurement loop is determined by a summation of the respective measurement loop and the respective artificial high grid.

14. The computer program product of claim 13, wherein an average is formed from the at least one compensated measurement loop in order to obtain a final calculated grid of positions of structures or sites on the substrate.

15. The computer program product of claim 9, wherein the temperature of the stage and the temperature of the substrate are measured in order to determine a temperature difference between the substrate and the stage when the at least one measurement loop is carried out.

16. The computer program product of claim 9, wherein the temperature of the stage and the temperature of the substrate are measured during the run of the at least one measurement loop in order to determine any changes of a temperature difference between the substrate and the stage during the run of the at least one measurement loop.

* * * * *